(12) United States Patent
Gailus et al.

(10) Patent No.: US 7,630,210 B2
(45) Date of Patent: Dec. 8, 2009

(54) LEAD(PB)-FREE ELECTRONIC COMPONENT ATTACHMENT

(75) Inventors: Mark W. Gailus, Somerville, MA (US); Leon M. Khilchenko, Manchester, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 11/604,710

(22) Filed: Nov. 28, 2006

(65) Prior Publication Data

US 2007/0205497 A1    Sep. 6, 2007

Related U.S. Application Data

(60) Provisional application No. 60/740,899, filed on Nov. 29, 2005.

(51) Int. Cl.
*H05K 7/00* (2006.01)
(52) U.S. Cl. .................. 361/777; 174/262; 174/267
(58) Field of Classification Search ............ 361/777; 174/262, 267; 228/180
See application file for complete search history.

(56) References Cited

U.S. PATENT DOCUMENTS

| | | | |
|---|---|---|---|
| 2,206,662 A * | 7/1940 | Conradi et al. ............. 29/885 |
| 4,607,782 A | 8/1986 | Mims |
| 4,923,405 A * | 5/1990 | Munsterman et al. ......... 439/78 |
| 4,949,163 A * | 8/1990 | Sudo et al. .................. 257/698 |
| 4,990,402 A | 2/1991 | Kneringer |
| 5,122,064 A | 6/1992 | Zarreii |
| 5,241,134 A | 8/1993 | Yoo |
| 5,375,320 A | 12/1994 | Kinsman et al. |
| 5,440,454 A * | 8/1995 | Hashimoto et al. .......... 361/790 |
| 5,595,490 A | 1/1997 | Cohen et al. |
| 5,730,630 A | 3/1998 | Lacourse et al. |
| 6,042,386 A | 3/2000 | Cohen et al. |
| 6,152,742 A | 11/2000 | Cohen et al. |
| 6,307,161 B1 * | 10/2001 | Grube et al. ................. 174/260 |
| 6,530,790 B1 | 3/2003 | McNamara et al. |
| 6,537,087 B2 | 3/2003 | McNamara et al. |
| 6,578,754 B1 * | 6/2003 | Tung ....................... 228/180.22 |
| 6,593,535 B2 * | 7/2003 | Gailus ........................ 174/262 |
| 6,641,410 B2 | 11/2003 | McNamara et al. |
| 6,660,946 B2 * | 12/2003 | Saiki et al. .................. 174/267 |
| 6,768,064 B2 * | 7/2004 | Higuchi et al. .............. 174/267 |
| 6,776,659 B1 | 8/2004 | Stokoe et al. |
| 6,780,059 B1 | 8/2004 | Payne et al. |
| 6,814,619 B1 | 11/2004 | Stokoe et al. |

(Continued)

*Primary Examiner*—Tuan T Dinh
*Assistant Examiner*—Andargie M Aychillhum
(74) *Attorney, Agent, or Firm*—Blank Rome LLP

(57) ABSTRACT

A contact tail for an electronic component useful for attachment of components using conductive adhesive, which may be lead (Pb)-free. The contact tail is stamped, providing a relatively low manufacturing cost and high precision. The contact tail has a distal portion with a large surface area per unit length. The distal portion shapes conductive adhesive into a joint, holding the adhesive adjacent the lead for a more secure joint. Additionally, the distal portion holds adhesive to the contact tail before a joint is formed, facilitating the use of an adhesive transfer process to dispense adhesive. To further aid in the transfer of adhesive, the contact tail may be formed with concave portions, which increase the volume of adhesive adhering to the contact tail. By adhering an increased but controlled amount of adhesive to the contact tail, arrays of contact tails may be simply and reliably attached to printed circuit boards and other substrates.

44 Claims, 6 Drawing Sheets

U.S. PATENT DOCUMENTS

| | | | |
|---|---|---|---|
| 6,827,611 B1 | 12/2004 | Payne et al. | |
| 6,908,328 B2 | 6/2005 | Lei et al. | |
| 7,198,736 B2 | 4/2007 | Kasuga | |

* cited by examiner

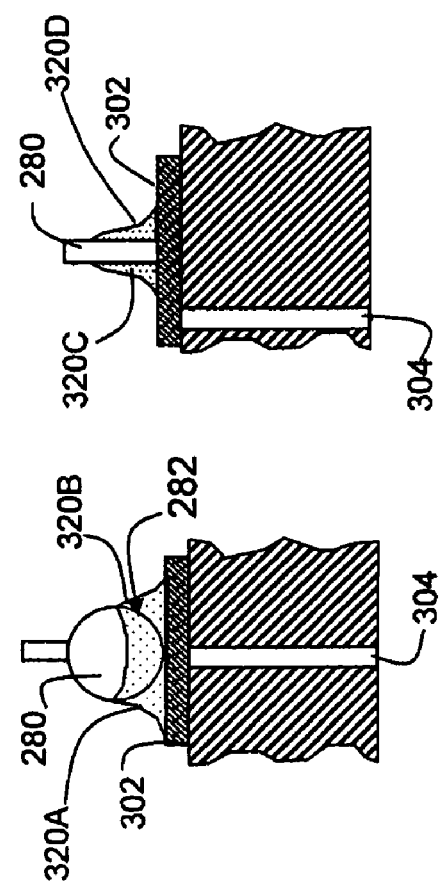
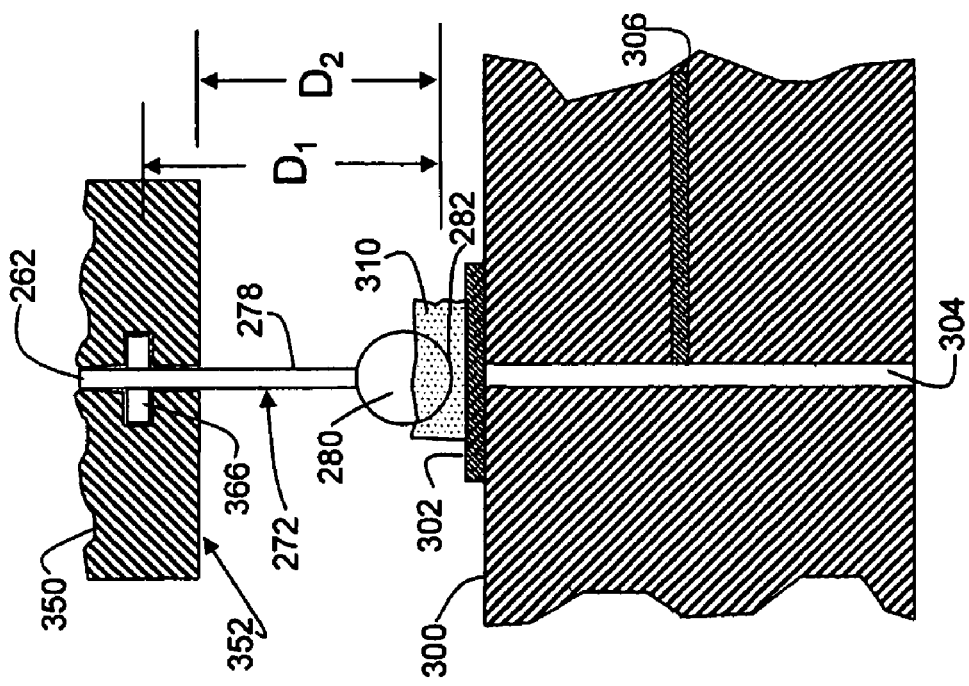
FIG. 3C
FIG. 3B
FIG. 3A

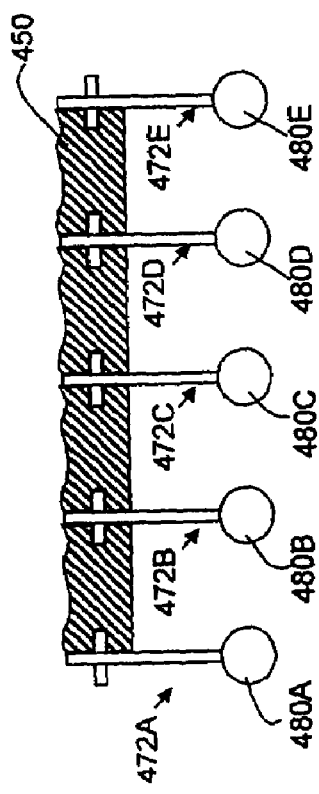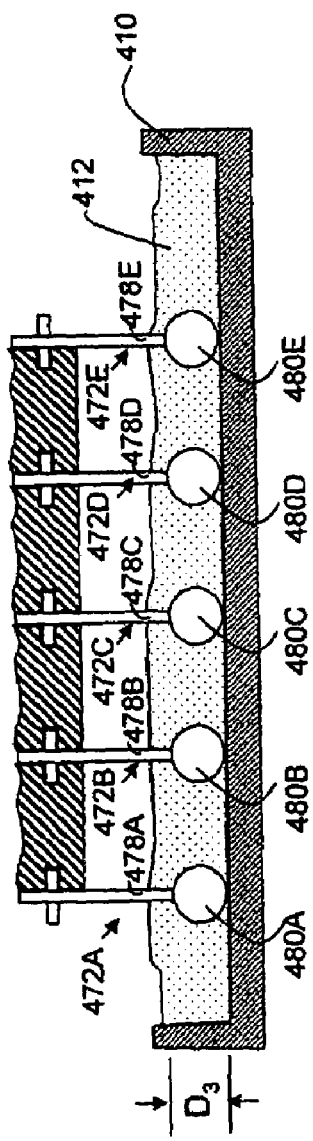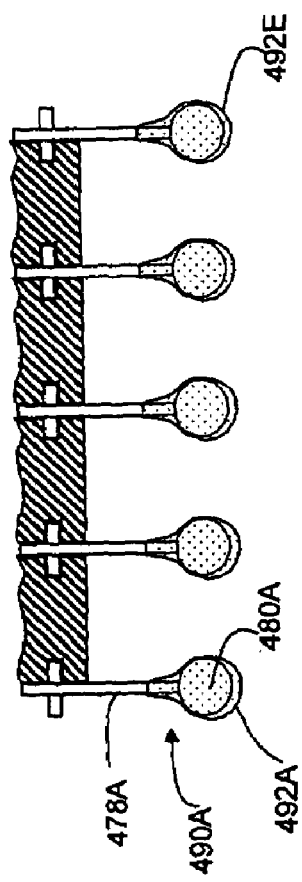

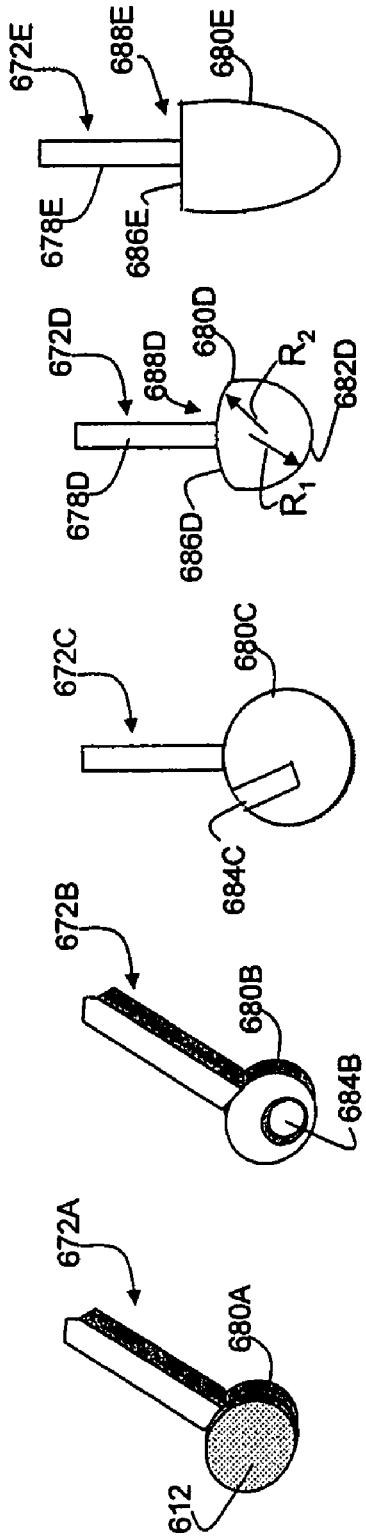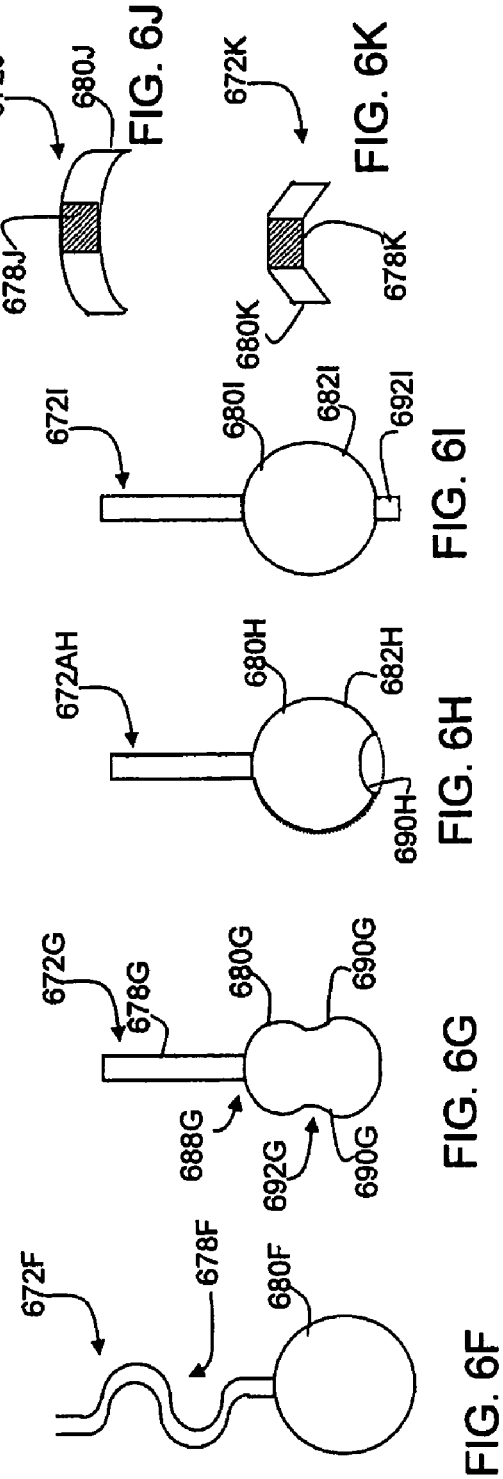

LEAD(PB)-FREE ELECTRONIC COMPONENT ATTACHMENT

RELATED APPLICATION

This application claims priority under 35 U.S.C. §119(e) to U.S. Provisional Patent Application Ser. No. 60/740,899, filed Nov. 29, 2005, which is incorporated herein by reference.

BACKGROUND OF INVENTION

1. Field of Invention

This invention relates generally to electronic assemblies and more specifically to the attachment of electronic components to substrates.

2. Background of the Related Art

Electronic assemblies are traditionally manufactured by attaching components to substrates, such as printed circuit boards. The substrates provide mechanical support for the components and have signal paths that electrically interconnect the components. In printed circuit boards and other types of substrates, signal paths between components are provided by conducting strips, called "traces." Often, traces are internal to the printed circuit board so holes, called "vias," are needed to extend from a surface of the printed circuit board to the traces. The vias are plated with conductive material to create an electrical connection between a component on the surface of the printed circuit board and a trace within the board.

The mechanism attaching components to the substrate should have desirable electrical and mechanical attributes. The attachment should electrically connect components to the vias in a way that provides little distortion of electrical signals passing between the component and traces of the substrate. Further, the attachment between the component and the substrate should be mechanically robust so that the electrical connection is not disrupted by forces on the interface between the component and the substrate as the electronic assembly is used. Many types of attachments have been used.

Early electronic assemblies were manufactured using a through-hole solder attachment technique. With this form of attachment, leads from components on the front side of a printed circuit board are inserted through the vias. Solder is applied to the back of the printed circuit board, often by dipping the leads in a solder bath. Molten solder tends to adhere to the metal of the lead and the plating of the via. Attractive forces between the molten solder and the lead draw the solder along the lead in a process sometimes called "wicking." When the solder cools and hardens, it makes an electrical connection between the lead and the plating of the via, and it also secures the lead in the via.

Press-fit connections have also been used. A press-fit connection also uses a via for attachment but relies on force generated by a contact tail to couple the contact tail to the via. A press-fit lead is stamped with a contact tail that has a compliant section. The compliant section is compressed as the lead is inserted into the via. Once inside the via, the complaint section generates a spring force against the walls of the via. The force creates both an electrical connection and a mechanical connection between the contact tail and the walls of the via.

More recently, the use of surface mount techniques has become prevalent. With surface mount techniques, vias are also used to make connections to traces or other conductors such as ground planes or power planes within the printed circuit board. The vias serve only as conducting paths between pads on the surface of the printed circuit board and traces internal to the printed circuit board. Because the vias do not receive leads or contact tails from components to be attached, the vias can often be made smaller in diameter than those used for through-hole or press-fit attachment. Smaller diameters allow the vias to be placed closer together or be positioned to allow more traces to be routed between vias in the area of the substrate where components are mounted. Either effect can lead to a smaller electronic assembly. Smaller diameter vias can also improve electrical performance.

Electronic components are attached by soldering leads from the components to the pads on the surface of the substrate. Such leads are often stamped from flat pieces of metal and then bent or "formed" into shapes. Commonly used shapes include "gull wing" leads and "J-leads." Though, in some instances, the leads may be simply posts that are not formed. Regardless of the shape, the leads are typically soldered to the pads using a reflow solder process.

In a reflow process, solder paste is positioned on the pad. Solder paste is viscous enough to hold a lead loosely in place when a component is placed on the board. Once components are placed on the board, the board is placed in an oven that heats the solder paste.

A fluxing agent and solder particles within the solder paste are transformed during heating. As the solder paste is heated, the fluxing agent becomes activated. At the beginning of the reflow process, the flux attacks oxide and other contaminants on the surfaces of the pad and the lead being interconnected. The flux also "wets" the surfaces to promote solder adhesion. As the flux is heated more, it turns into a gas that should escape from the solder paste. Simultaneously, the solder particles within the paste melt. The molten solder adheres to both the lead and the pad. When the molten solder cools, it solidifies to electrically and mechanically join the lead to the pad.

Surface mount techniques have also been developed using solder balls. In many cases, electronic components attached with solder balls do not have leads. Instead, both the component and the substrate have pads that align. Solder balls are placed between the pads and reflowed to secure the pads on the component to the pads on the substrate. Solder paste or flux may be used to hold the solder balls in place. As with other surface mounting techniques, the solder balls are reflowed and molten solder adheres to the pad on the substrate and the pad on the component. When the solder cools, it forms an electrical and mechanical connection between the pads.

Many variations of solder ball mounting are known. In some variations, the solder balls have solid cores, such as copper spheres. The spheres shape the solder joint and establish a spacing between the component and the substrate when soldered.

Surface mount techniques are often used when very high density interconnections are desired. Because there is no need for access to the pads to make a solder joint, arrays of pads can be formed on a substrate, and a component may be placed over the array of pads. Many electronic components are manufactured with an array of solder balls to align with such an array of pads. These components are often said to include "Ball Grid Array" (BGA) packaging.

The above-described attachment techniques have generally employed solder, which contains lead (Pb) (Because the word "lead" may refer to a material or a portion of an electronic component, where necessary to distinguish, the symbol Pb following the word "lead" indicates that the word refers to a material.). Because lead (Pb) is regarded as a hazardous material, electronic assemblies formed using solder attachment may require special processing when their useful life is exceeded and the electronic assemblies are discarded. The use of conductive adhesives in place of lead (Pb)-based solder has been proposed as a way to avoid disposal difficulties associated with electronic assemblies containing lead (Pb)-based solder. It would be desirable to have an improved attachment mechanism that does not involve lead (Pb)-based solder.

SUMMARY OF INVENTION

In one aspect, the invention relates to a method of manufacturing an electronic assembly of the type having a component and a substrate. The substrate has a conductive pad formed thereon and the component has a lead electrically and mechanically secured to the pad. The lead has a first portion extending from the component and a second portion extending from the first portion. The second portion has a surface area per unit length greater than the first portion. The method involves coating the second portion at least partially with an uncured conductive adhesive, positioning the component to bring the uncured conductive adhesive in contact with the pad and curing the conductive adhesive.

In another aspect, the invention relates to a method of manufacturing an electronic assembly. The method includes providing a component having a lead with a paddle, coating the paddle at least partially with an uncured conductive adhesive, positioning the component to bring the uncured conductive adhesive in contact with a conductive structure on a substrate and curing the conductive adhesive.

In another aspect, the invention relates to an electronic assembly. The electronic assembly includes a component, a substrate, and a conductive pad formed on the substrate. A lead extends from the component and is electrically and mechanically secured to the pad. The lead has a first portion extending in a first direction from the component and a second portion extending in the first direction from the first portion. The second portion has a surface area per unit length greater than the first portion. A cured conductive adhesive secures the second portion to the pad.

BRIEF DESCRIPTION OF THE FIGURES

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3A is a sketch of a contact tail of the lead frame of FIG. 2 in one stage of manufacture of an electronic assembly;

FIG. 3B is a sketch of the contact tail of FIG. 3A in a subsequent stage of manufacture of the electronic assembly;

FIG. 3C is a side view of a portion of the contact tail shown in FIG. 3B;

FIGS. 4A-4C are sketches of an array of contact tails in successive stages of manufacture of the electronic assembly;

FIG. 6A is a sketch of a contact tail according to an alternative embodiment of the invention;

FIG. 6B is a sketch of a contact tail according to an alternative embodiment of the invention;

FIGS. 6C-6I are sketches of front views of contact tails according to alternative embodiments of the invention; and FIGS. 6J and 6K are sketches of top views of contact tails according to alternative embodiments of the invention.

DETAILED DESCRIPTION

Figure 1A:
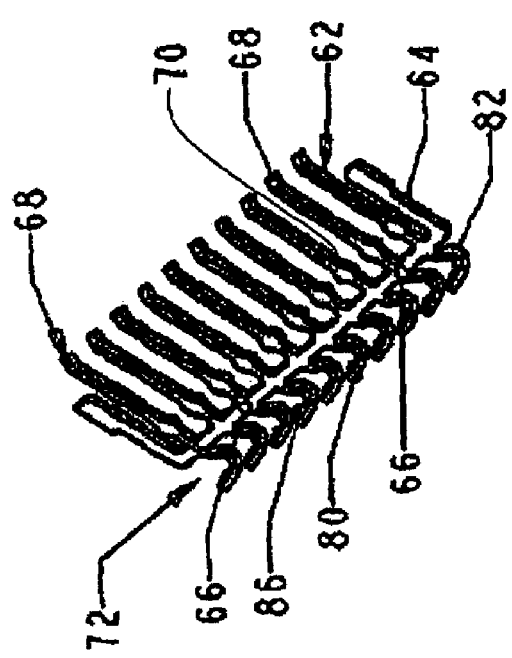
FIG. 1A is a sketch of a lead frame from a prior art electrical connector.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In manufacturing electronic assemblies, it would be desirable to have a low cost and reliable method for attaching components to substrates. In addition, it would be desirable for the low cost, reliable attachment method to allow for a high density of interconnections. It would also be desirable for the attachment mechanism to not require lead (Pb)-based solder.

As is described in the above background, ball grid arrays have been used to attach components to substrates. Ball grid arrays are desirable because they provide for a relatively large number of interconnections between a component and a substrate in a relatively small area. For example, ball grid arrays have been used to attach packaged semiconductor components as well as other components, such as electrical connectors and chip sockets.

An attachment system for electronic components has been developed that has the density advantages of a ball grid array, but is low cost and reliable. In embodiments of the invention, components may be simply attached to a substrate with a conductive adhesive or other lead (Pb)-free material. The attachment system is particularly useful for components with leads, such as connectors and sockets. As used herein, the term "substantially free of lead (Pb)" is used with a recognition that it may be impossible or impractical to remove trace amounts of lead which may be contained in the individual component(s) of the conductive adhesive in accordance with the invention. Accordingly, as used herein, the term "substantially free of lead (Pb)" means less than 1000 parts per million (ppm) of lead is present in the conductive adhesive in accordance with the invention.

Figure 1B:
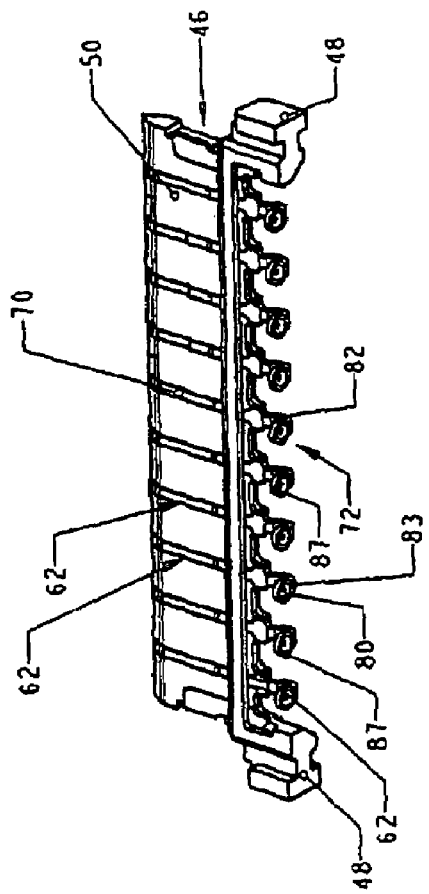
FIG. 1B is a sketch of a prior art connector component incorporating the lead frame of FIG. 1A.

The Prior Art as Shown in FIGS. 1A and 1B

FIGS. 1A and 1B show portions of a prior art electrical connector designed for attachment to a printed circuit board using a ball grid array. FIG. 1A shows a lead frame 64 designed to be incorporated into a connector with ball grid array attachment. Lead frame 64 may, for example, be stamped from a sheet of metal to create a structure of the desired profile. The structure may then be formed to incorporate bends and curves or other shapes as appropriate.

In the illustrated configuration, the stamping operation produces multiple signal conductors 62. Each signal conductor 62 has a mating contact portion 68, an intermediate portion 70 and a contact tail 72. The mating contact portion 68 is shaped to make contact with a corresponding signal conductor in a mating connector portion. The contact tail 72 is shaped for attachment to a substrate, such as a printed circuit board, using solder balls. The intermediate portion 70 provides a signal path between contact tail 72 and mating contact portion 68.

When lead frame 64 is stamped, the individual conductors 62 are initially joined by tie bars 66. The tie bars 66 facilitate easy handling of the conductors 62 as a group. The tie bars 66 are severed at a subsequent stage of manufacture of the connector to produce electrically separate conductors 62.

FIG. 1B shows lead frame 64 assembled into a component 46. In this example, component 46 is a wafer that may be used to assemble a stacking or mezzanine-style electrical connector such as is pictured in U.S. Pat. No. 6,537,087, which is hereby incorporated by reference.

The component includes an insulative housing 50 molded around the signal conductors 62 of lead frame 64. The mating contact portions 68 and the contact tails 72 are exposed in housing 50. Housing 50 may also include features, such as shoulders 48, for mounting or positioning component 46. In the pictured embodiment, shoulders 48 allow component 46 to be inserted into an organizer with other similar wafers and also sets a spacing between component 46 and a substrate to which component 46 may be attached.

Each of the conductors 62 includes a contact tail 72. In the illustrated embodiment, each of the contact tails 72 is shaped to received a solder ball (not shown). When components 46 are assembled into an organizer, pads 80 of contact tails 72 are positioned generally in parallel so that solder balls on pads 80 may make contact with an array of pads on the surface of a printed circuit board.

The contact tails 72 may be shaped to aid in retaining a solder ball. For example, each pad 80 may be formed with a dimple 86 that aids in securing a solder ball to the pad. Additionally, edges such as 87 and 83 aid in retaining solder on the pads 80. Each of the pads 80 may also be coated with solder wettable material to further aid in retaining solder on the pads 80.

The Invention

Figure 2:
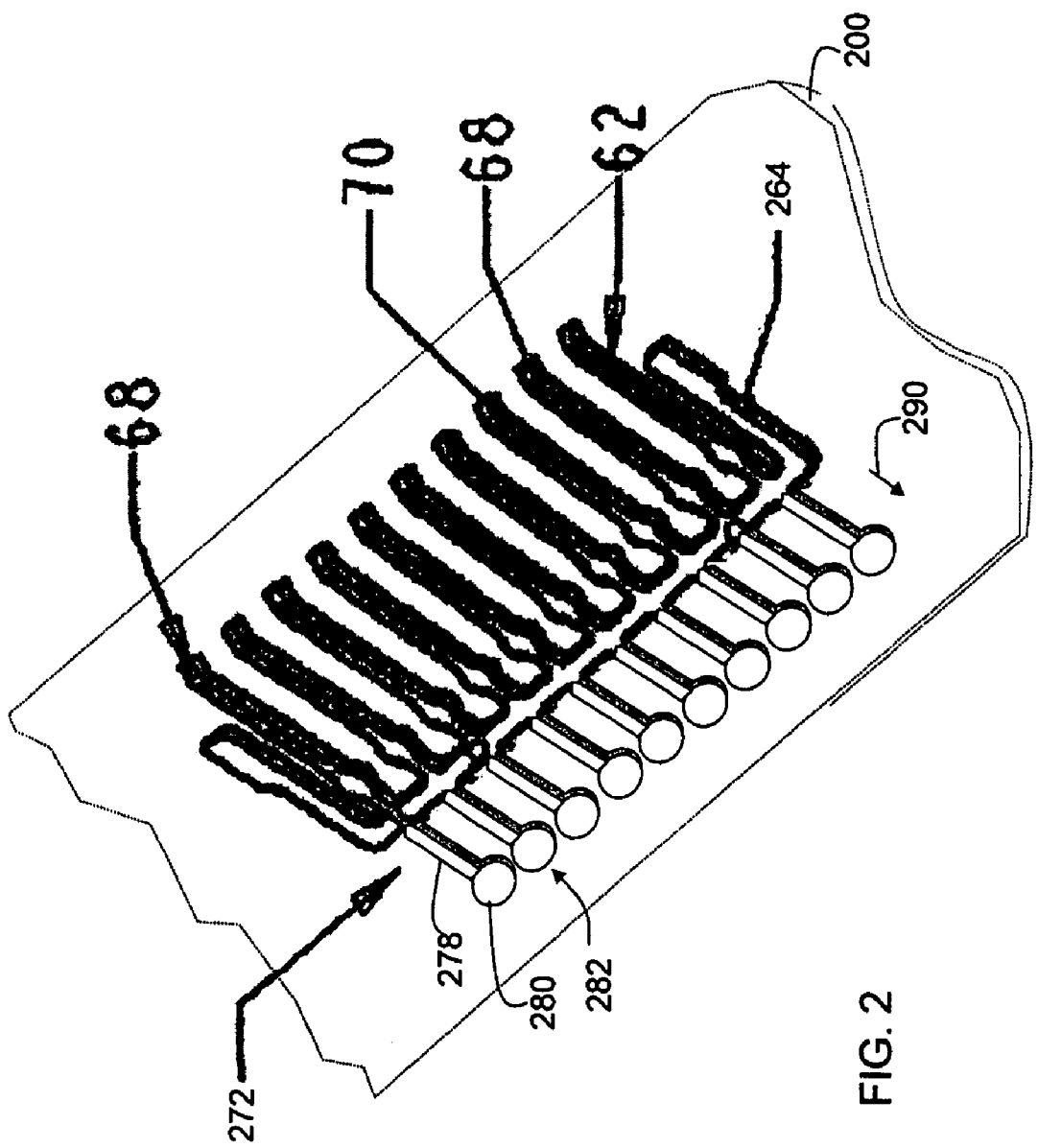
FIG. 2 is a sketch of a lead frame according to an embodiment of the invention.

FIG. 2 shows an alternative design for a lead frame that may be used for lead (Pb)-free attachment of electronic components according to a presently preferred embodiment of the invention. Lead frame 264 has contact tails 272 that may be attached to pads on the surface of a substrate and may be used in a component in place of lead frame 64.

As with lead frame 64, lead frame 264 contains a plurality of conductors 62. Each of the conductors 62 includes a mating contact portion 68 and an intermediate portion 70. In this example, the mating contact portions and intermediate portions of the conductors 62 in lead frame 264 have the same shape as in lead frame 64 (FIG. 1A). However, these portions may have any desired shape appropriate for the functionality of the component in which lead frame 264 is used. For example, mating contact portions 68 may include compliant sections or be in any other shape to make a separable electrical connection with a conductor in a mating connector. As another example, mating contact portions 68 may be designed to contact balls, leads, pads or other structures on semiconductor chips to be held in a chip socket incorporating lead frame 264.

The contact tails 272 have a shaft portion extending in direction 290 from intermediate portions 70. In the illustrated embodiment, the shaft of each signal conductor is in the form of post 278. When lead frame 264 is held within a housing forming an electrical component, post 278 may extend from the housing in direction 290.

Each post 278 widens into a distal portion that has a greater surface area per length in direction 290 than post 278. In the embodiment illustrated, each distal portion is in the shape of paddle 280. As can be seen in the embodiment of FIG. 2, each paddle 280 has a width greater than the width of posts 278.

In the illustrated embodiment, lead frame 264 is made from a sheet of metal 200 (shown in phantom). Lead frame 264 may be stamped from sheet 200. As a result, each paddle has a major surface parallel to direction 290 and an edge 282 that is orthogonal to that direction. If a coating over any portion of contact tail 272 is desired, that coating may be applied to sheet 200 before stamping or may be applied to contact tail 272 after stamping. Coatings may be used to reduce oxide formation or for other purposes.

If desired, mating contact portion 68 and intermediate portion 70 may be formed to have curves or other structural features as appropriate for the intended application of lead frame 264. However, in the illustrated embodiment, contact tails 272 are not formed. Rather, all dimensions of the contact tails 272 may be defined in a stamping operation, which is inherently more precise than a forming operation.

Lead frame 264 may be incorporated into an electronic component, which may then be attached to a substrate, such as a printed circuit board. FIG. 3A shows a contact tail 272 of such a component as it is being attached to a printed circuit board 300. In this illustration, circuit board 300 includes a pad 302 joined to trace 306 internal to printed circuit board 300 by via 304. Circuit board 300 may be a printed circuit board formed using conventional processing, but any suitable substrate may be used.

Uncured adhesive 310 is placed on pad 302. Uncured adhesive 310 may be applied in any suitable way, such as by screening or with a dispenser. When an electronic component containing contact tail 272 is placed on circuit board 300, paddle 280 is inserted in uncured adhesive 310. FIG. 3A illustrates contact tail 272 after a component is placed on circuit board 300, but before uncured adhesive 310 is cured.

Uncured adhesive 310 may be a conventional conductive adhesive, but any suitable conductive adhesive may be used. The conductive adhesive may include a binder and one or more conductive fillers. For example, an epoxy or other polymer may be used as the binder. The binder may be a thermosetting material. In some embodiments in which thermosetting materials are used, the binder may cure at temperatures above ambient temperature, but less than 150° C. However, any suitable method of curing may be employed. As another example, binder materials that cure upon application of UV energy or any other controllable form of energy may be employed. Further, a multi-part binder may be employed. When a multi-part binder is used, a resin and curing agent may be mixed prior to application of uncured adhesive 310 to a substrate. Contact tail 272 may then be inserted in uncured adhesive 310 prior to the time that the uncured adhesive sets. Even if a multi-part binder is used, energy may be applied to the uncured adhesive 310, such as by heating, to accelerate the curing process.

The filler for the uncured adhesive may include conducting material. Metal particles, such as fibers or flakes, may be used. In some embodiments, silver particles are used as a filler. The binder may be loaded with a volume percentage of filler sufficient to provide a joint with the desired conductivity when the uncured adhesive is cured.

Contact tail 272 may be shaped to facilitate accurate placement in uncured adhesive 310. Contact tail 272 is shown to be a portion of a signal conductor 262 that is mounted within housing 350 of an electronic component. In the illustrated embodiment, signal conductor 262 includes retention features 366 intended to retain signal conductor 262 within housing 350. Retention features 366 may be stamped along with contact tail. As a result, distance $D_1$ between retention feature 366 and edge 282 of paddle 280 facing circuit board 300 is defined during the stamping operation.

Similarly, the distance $D_2$ defining the position of edge 282 relative to lower surface 352 is well controlled. If housing 350 includes a shoulder or other feature that serves to set the spacing of lower surface 352 from the upper surface of printed circuit board 300, a well-controlled tolerance on the distance $D_2$ increases the likelihood that paddle 280 will be accurately positioned relative to uncured adhesive 310. Accurate positioning of paddle 280 relative to uncured adhesive increases the robustness of a joint formed between paddle 280 and pad 302 when uncured adhesive 310 is cured.

As one example, the dimension $D_1$ may be between about 20 and 60 mils (0.5 to 1.5 mm). $D_2$ may be between about 30 and 100 mils (0.7 to 2.5 mm). Post 278 may have a width of about 4 to 12 mils (0.1 to 0.3 mm) and paddle 280 may have a width of about 8 to 35 mils (0.2 to 0.9 mm).

The shape of contact tails 272 may also increase the robustness of joints formed between paddle 280 and pad 302. In the illustrated embodiment, edge 282 is curved. This curve provides a ready path for volatized solvent or other gases within uncured adhesive 310 to escape from uncured adhesive 310 as it cures, reducing the chance that joints formed using contact tails 272 will contain voids.

Other aspects of contact tails 272 may also lead to more robust joints. Uncured adhesive 310 may have a sufficiently low viscosity that it "wicks." The shape of contact tail 272 dictates the regions into which uncured adhesive 310 will wick. Contact tail 272 may be shaped to direct adhesive into regions that form a robust joint. Conversely, adhesive may be directed away from regions where the adhesive could interfere with operation of an electronic assembly. As shown in FIG. 3B, when uncured adhesive 310 wicks, the adhesive will adhere to contact tail 272 to form two well-defined heels 320A and 320B along the curved edge 282. Similarly, FIG. 3C, showing a side view of contact tail 272, illustrates two well-defined fillets 320C and 320D formed around the flat surface of paddle 280.

In the embodiment shown in FIGS. 3A, 3B, and 3C, the wicking action that draws uncured adhesive towards contact tail 272 also draws the uncured adhesive away from via 304. In prior art designs, vias beneath surface mount pads were avoided because solder could be drawn into the vias, leaving too little solder on the pad to form a reliable joint. With wicking action drawing uncured adhesive into well-defined heels 320A and 320B and well-defined fillets 320C and 320D instead of into a via, a via 304 may be placed beneath pad 302 without compromising the reliability of a joint formed on the pad. The ability to place vias beneath the joint region of the pad may reduce the area needed to mount a component.

FIGS. 3A . . . 3C demonstrate how the shape of a contact tail 272 may be used to control the shape of a joint formed by an uncured adhesive initially deposited on a pad. The shape of a contact tail, such as contact tail 272, may also be used to control the shape of a joint formed through an adhesive transfer process. In an adhesive transfer process, uncured adhesive may be coated on a portion of contact tail 272 prior to positioning the contact on a pad. An adhesive transfer process eliminates the need to deposit uncured adhesive 310 on pad 302.

FIGS. 4A-4C illustrate an adhesive transfer process. An electronic component having a housing 450 contains an array of contact tails, of which contact tails 472A . . . 472E are illustrated. In this embodiment, each of the contact tails 472A . . . 472E has the same shape as the contact tail 272 (FIG. 2), but any suitable contact tail configuration may be used.

FIG. 4B shows the electronic component positioned with the array of contact tails 472A . . . 472E placed in a bath of conductive adhesive. In the embodiment illustrated, a tray 410 may be used to hold uncured adhesive 412. Tray 410 may be filled to a depth $D_3$ with uncured adhesive 412. The depth $D_3$ is sufficient to immerse at least a portion of paddles 480 . . . 480E of the contact tails in the uncured adhesive. In the pictured embodiment, the uncured adhesive 412 has a depth $D_3$ such that when an electronic component is placed in tray 410, the uncured adhesive 410 extends above paddles 480A . . . 480E, wetting a portion of post 478A . . . 478E of each of the contact tails 472A . . . 472E.

FIG. 4C shows a latter step in the manufacturing process. As pictured in FIG. 4C, the electronic component is removed from tray 410. The component may be held over tray 410 to allow excess uncured adhesive to drip off the array of contact tails 472A . . . 472E. After excess uncured adhesive is allowed to drip from the array of contact tails 472A . . . 472E, a sufficient amount of uncured adhesive is retained on each of the contact tails 472A . . . 472E to form a reliable joint. As shown in FIG. 4C, a drop 492A . . . 492E of conductive adhesive is formed around each of the contact tails.

The volume of each drop 492A . . . 492E is dictated in part by the surface area of each paddle 480A . . . 480E dipped into uncured conductive adhesive 412 (FIG. 4B). Because each paddle 480A . . . 480E has a surface area per unit length that is larger than the surface area per unit length a respective post 478A . . . 478E, each drop 492A . . . 492E will have a greater volume than if a contact tail without such a paddle 480A . . . 480E were used in an adhesive transfer process. To further increase the amount of uncured adhesive transferred, each contact tail 472A . . . 472E includes a concave region 490A . . . 490E at the intersection of each post 478A . . . 478E and its respective paddle 480A . . . 480E. Each concave region 490A . . . 490E also retains uncured adhesive when the contact tail 472A . . . 472E is removed from tray 410.

In the embodiment illustrated, the shape of contact tails 472A . . . 472E significantly influences the volume of drops 492A . . . 492E. Though variations in the depth $D_3$ (FIG. 4B) may also influence the volume, the depth $D_3$ has a relatively small influence. If the depth $D_3$ is such that a larger portion of the posts 478A . . . 478E is immersed in the uncured adhesive 412, each post 478A . . . 478E has a relatively small surface area and does not retain much of the uncured adhesive when removed from tray 410. Therefore, a contact tail, such as contact tails 472A . . . 472E promotes a generally uniform amount of adhesive transferred despite variations in the manufacturing process.

Figure 5:
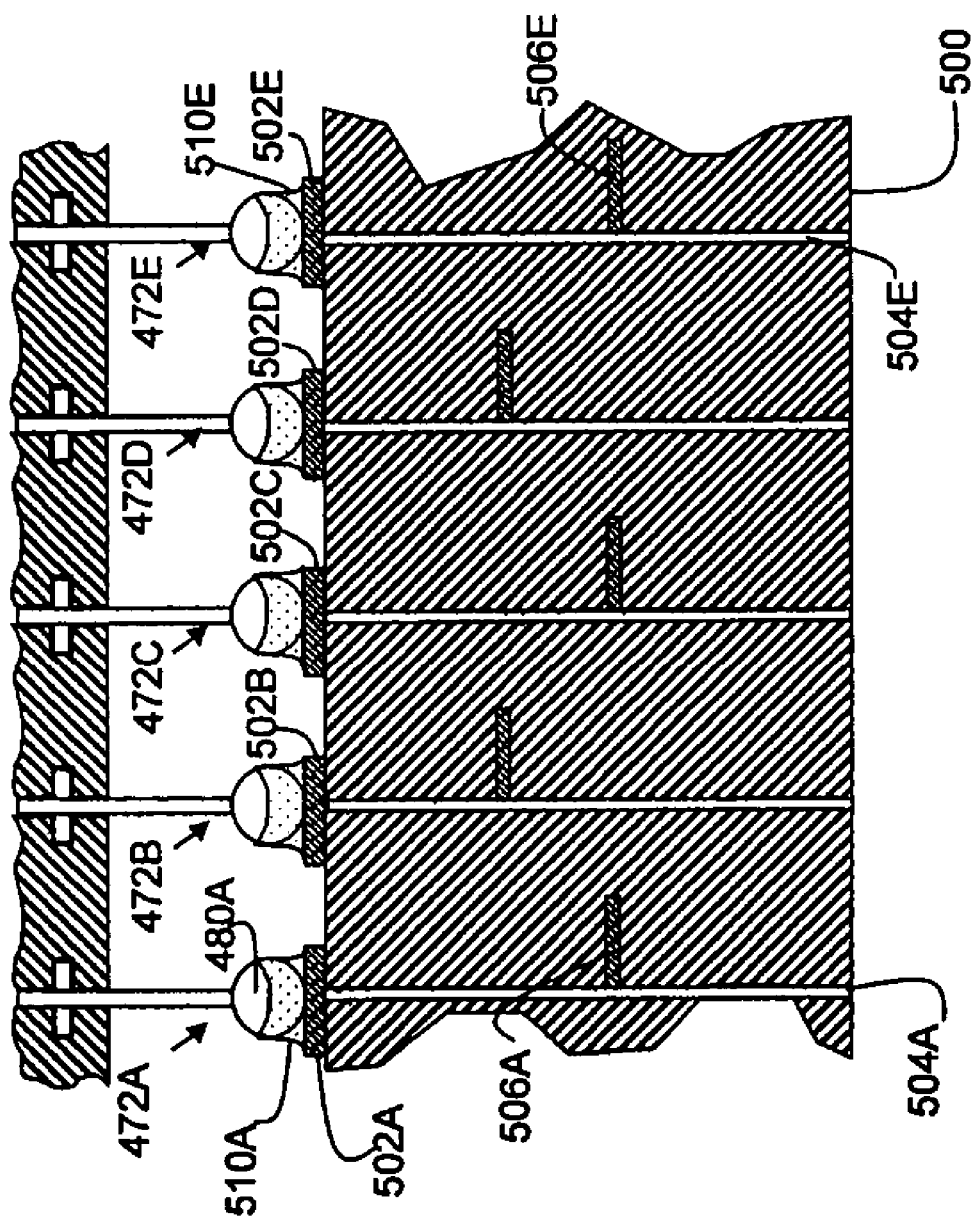
FIG. 5 is a sketch of the array of contact tails of FIGS. 4A-C attached to a substrate.

FIG. 5 shows the electronic component moved to position the array of contact tails 472A . . . 472E on pads 502A . . . 502E (only a portion of which are numbered) of a printed circuit board 500. After the array of contact tails 472A . . . 472E is placed, the uncured adhesive may flow because of gravity and wicking action. The uncured adhesive will flow into spaces between each of the paddles 480A . . . 480E and its respective pad 502A . . . 502E. The adhesive may then be cured, securing each of the paddles 480A . . . 480E to a respective pad 502A . . . 502E and forming joints 510A . . . 510E (only a portion of which are numbered).

Because sufficient uncured adhesive is provided through the transfer process of FIGS. 4A-4C, each joint 510A . . . 510E is formed with defined heels and fillets, generally in the shape shown in FIGS. 3B and 3C. This shape is dictated in large part by the shape of the contact tails 472A ... 472E, which have a wide paddle portion and a curved edge facing a pad on the substrate.

Each joint also provides a desirable electrical connection, creating an electrical connection from contact tail 472A to pad 502A and through via 504A to a trace 506A within printed circuit board 500. Similar electrical connections are provided from contact tails 472B ... 472E to respective traces 506A ... 506E.

Further each joint is separate, without conductive adhesive from one joint bridging to another joint or otherwise wicking into areas of the electronic assembly that could interfere with its operation. Bridging of joints is prevented by the shape of the contact tails that tends to draw uncured adhesive into fillets and heels as pictured. Also, concave regions, such as 490A ... 490E, (FIG. 4C) tend to retain any excess adhesive rather than allowing it to flow to adjacent joints or to wick up posts 478A ... 478E. In addition, the shape of contact tails 472A ... 472E in the array may transfer a uniform amount of adhesive, which reduces the likelihood that excessive adhesive from one contact tail 472A ... 472e will bridge to an adjacent pad.

Turning now to FIGS. 6A-6K, alternative embodiments of contact tail 272 (FIG. 2) are shown. Each of the contact tails 672A ... 672K in FIGS. 6A-6K may be manufactured by stamping the contact tail 672A ... 672K from a sheet of metal. Each of the pictured contact tails 672A ... 672K may be a portion of a signal conductor for use in an electronic component. Each contact tail 672A ... 672K may be manufactured as part of a lead frame or other structure to facilitate manufacture of the electronic component. FIGS. 6A-6K are illustrative of the various shapes in which a contact tail may be made.

FIG. 6A shows a contact tail 672A. Contact tail 672A has a shape similar to contact tail 272 (FIG. 2) with a generally circular paddle 680A. In the embodiment of FIG. 6A, an adhesive pre-form 612 is attached to paddle 680A. A contact tail such as contact tail 672A with an adhesive pre-form 612 attached may be used to manufacture an electronic assembly in which electronic components are attached to a substrate without first depositing adhesive on pads of the substrate or using an adhesive bath, such as is shown in FIG. 4B. Adhesive pre-form 612 may be formed of a material that softens sufficiently to flow at a temperature below the temperature needed to fully cure it. In this way the pre-form will become molten as it is heated, forming fillets attaching contact tail 672A to a pad, before the adhesive cures.

FIG. 6B shows an alternative embodiment of a contact tail. In the embodiment illustrated in FIG. 6B, contact tail 672B has a hole 684B formed through it. Hole 684B may be manufactured in any suitable way. For example, hole 684B may be created by drilling or punching through paddle 680B and may be created as part of the same stamping operation used to create contact tail 672A. When paddle 680B is inserted into uncured adhesive which is then cured, uncured adhesive may fill hole 684B. Having adhesive extend through hole 684B may strengthen the mechanical connection between contact tail 672B and the substrate onto which it is mounted. Additionally, having a hole in paddle 680B may increase the amount of adhesive adhering to paddle 680B in an adhesive transfer process. In the embodiment shown, hole 684B is at the lower portion of paddle 680B. However, hole 684B may be positioned in any portion of paddle 680B.

FIG. 6C shows a contact tail 672C. As in the embodiments in FIGS. 6A and 6B, contact tail 672C has a generally disk-shaped paddle 680C. Hole 684C is punched in paddle 680C. In this embodiment, hole 684C intersects the perimeter of paddle of 680C, forming a slot in paddle 680C. The remaining material of paddle 680C has a J-shaped profile. By appropriate selection of the size of the hole 684C relative to the size of paddle 680C, paddle 680C may have flexibility that mimics the flexibility of a J-lead but is created without a forming operation.

In a contemplated embodiment, the contact tails shown in FIGS. 6C-6I are stamped from a metal sheet. Therefore, only the outline of the stamped contact tails 672C ... 672I is shown as each will be generally planar. Though not expressly shown in FIGS. 6C-6I, each of the contact tails 672C ... 672I pictured will have a thickness approximately equal to the thickness of the metal sheet from which the contact tails 672C ... 672I are stamped. In some contemplated embodiments, each contact tail 672C ... 6762I will have a thickness of between about 4 and 12 mils (0.1 to 0.3 mm).

FIG. 6D shows a further possible embodiment. Contact tail 672D has a lower edge 682D. As described above, lower edge 682D faces the substrate when contact tail 672D is mounted to the substrate. Edge 682D presents a relatively small surface area of contact tail 672D to the adhesive securing the contact tail to a pad. This relatively small surface area reduces the likelihood that gas will be trapped in the uncured adhesive during a curing operation to create voids in the joint holding contact tail 672D to the pad. A curved edge 682D further reduces entrapment of gas within the uncured adhesive because gas will generally follow the curved edge to the surface of the uncured adhesive, where the gas escapes. Accordingly, embodiments illustrated above that include a generally circular paddle reduce the entrapment of gases in the joint.

It is not necessary, however, that the paddle of the contact tail be circular. In the embodiment of FIG. 6D, contact tail 672D has a lower edge 682D of radius $R_1$. The upper edge 686D is also curved but has a larger radius, here illustrated as radius $R_2$. Creating upper edge 686D with a larger radius can create a larger concave region 688D above upper edge 686D to retain adhesive in an adhesive transfer process. Additionally, creating upper edge 686D with a larger radius forms a more acute angle between post 678D and upper edge 686D. Creating a more acute angle increases the affinity for uncured adhesive to be retained in concave region 688D.

FIG. 6E shows a contact tail 672E with an even larger retention region 688E. In this embodiment, an upper edge 686E is relatively flat and perpendicular to a post 678E.

FIG. 6F shows a further embodiment. Contact tail 672F includes a post 678F with multiple bends. The serpentine shape of post 678F provides flexibility. Such flexibility may be desirable to absorb thermal stress created by different rates of thermal expansion between an electrical component with an array of contacts and a substrate. Preferably, post 678F is created as part of the same stamping operation that creates paddle 680F. Even though contact tail 672F may provide flexibility, similar to a formed lead, it provides the tight manufacturing tolerances available through a stamping operation.

FIG. 6G shows a contact tail 672G. Contact tail 672G includes a paddle 680G having indented side portions 690G. Indented side portions 690G create additional concave regions 692G. Additional concave regions 692G may increase the volume of adhesive that adheres to paddle 680G during an adhesive transfer process and therefore may promote a more reliable joint.

FIG. 6H illustrates yet a further embodiment of a contact tail. Contact tail 672H includes a lower edge 682H with a discontinuous portion 690H. The discontinuous portion 690H is formed by removing a lens shaped portion from an otherwise circular paddle as shown in FIG. 6A. FIG. 6H demonstrates that the edge of contact tail 672H facing a printed circuit board does not need to be round. Contact tail 672H is just one example of possible alternative embodiments without a rounded edge. As another example, discontinuous portion 690H may form a slot extending further into paddle 680H.

FIG. 6I illustrates a contact tail 672I having a paddle 680I. In this embodiment, the paddle 680I is generally circular. FIG. 6I illustrates that the edge 682I of the paddle 680I need not press directly against a pad on a substrate. In the illustrated embodiment, projection 692I extending from the paddle 680I will be positioned between the edge 682I and a pad on a substrate to which contact tail 672I may be mounted. Projection 692I may be created in the same stamping operation used to form the paddle 680I.

FIGS. 6J and 6K illustrate further alternative embodiments of a contact tail. In the embodiments described above, each of the contact tails 672J and 672K is created in a stamping operation. Though forming was described to shape the mating contact portions and intermediate portions of signal conductors, in the above-described embodiments, no part of the contact tail was shaped in a forming operation. FIGS. 6J and 6K demonstrate that lack of a forming operation need not be a limitation on the invention. In the embodiment of FIG. 6J, contact tail 672J is shown in a top view. In this view, it can be seen that paddle 680J may be formed to include a curve. Such a curve may, for example, be desirable to allow paddle 680J to have a larger surface area without requiring a wider pad. A wide surface area may be desirable to increase the amount of adhesive adhering to paddle 680J in an adhesive transfer operation or in a joint holding a contact tail to a pad. In the illustrated embodiment, no curves in direction 290 (FIG. 2) of shaft 678J are formed. As a result, dimensions along post 278J, such as distance $D_1$ and $D_2$ (FIG. 3A), are defined with the high precision of a stamping operation.

FIG. 6K shows a further embodiment in which portions of contact tail 672K are formed. In the embodiment illustrated in FIG. 6K, a paddle 680K is folded about the axis of post 678K. The fold in paddle 680K may increase the surface area of paddle 680K. As is the case with contact tail 672J, such a configuration may increase the amount of adhesive delivered in an adhesive transfer process or may shape the joint mounting paddle 680K to a pad.

In embodiments of the invention more than one component may be attached to the substrate. The invention provides for a method of manufacturing an electronic assembly wherein a first component having a lead with a paddle is provided. The paddle is coated at least partially with an uncured conductive adhesive. The first component is positioned to bring the uncured conductive adhesive in contact with a conductive structure on a substrate. A plurality of leads on a second component are coated with uncured conductive adhesive on a paddle area of the lead. The paddles on the second component may be coated at least partially with the uncured conductive adhesive, in a similar manner as the paddles of the leads of the first component, or may be coated in a different manner from the paddles of the leads of the first component. The second component is positioned relative to the substrate with the uncured conductive adhesive of the paddles of the plurality of leads each in contact with another or same conductive structure on the substrate. The step of curing the uncured conductive adhesive may occur after positioning the second component relative to the substrate and the step of curing comprises curing the conductive adhesive of the first and second components.

The step of curing also may occur individually and separately in time for the first and second components, if necessary. It may be advantageous to position components and complete a partial cure or complete a full cure before proceeding. The assembly can be completed in stages. For example, a first assembly stage can include a first coating of the paddles of the lead of the first component with the uncured conductive adhesive, positioning the lead to contact with the conductive structure on the substrate, and curing or partially curing the first coating of the uncured adhesive. Then, in a second assembly stage, the second component can be similarly coated with a second coating of conductive adhesive. After the second component is positioned to contact the same or another conductive structure on the substrate, the second coating can be cured or partially cured. Further assembly stages can follow.

Having thus described several aspects of at least one embodiment of this invention, it is to be appreciated that various alterations, modifications, and improvements will readily occur to those skilled in the art.

For example, contact tails are described for use on signal conductors in electrical connectors. However, their use is not limited to that application. Contact tails according to the invention may be used in conjunction with ground leads, shields, plates or other conductive members within an electrical connector. Likewise, the contact tails may be used in conjunction with other components, such as chip sockets, chip carriers and semiconductor devices.

As a further example, each pad is shown to be flat. However, the invention is not limited to use in conjunction with flat pads. A "pad" more generally refers to a conductor of any shape to which contact may be made.

Such alterations, modifications, and improvements are intended to be part of this disclosure, and are intended to be within the spirit and scope of the invention. Accordingly, the foregoing description and drawings are by way of example only.

We claim:

1. An electronic assembly, comprising:
   a) a component with a lower surface;
   b) a substrate disposed opposite the lower surface of the component;
   c) a conductive pad formed on the substrate;
   d) a lead extending from the lower surface of the component, the lead electrically and mechanically secured to the conductive pad,
   wherein the lead has a first portion extending in a first direction from the component and a second portion, extending in the first direction from the first portion, the second portion having a surface area per unit length greater than the first portion and having a substantially planar surface generally parallel to the first direction with an edge that contacts the conductive pad formed on the substrate; and
   e) a cured conductive adhesive securing a portion of the edge and a portion of the second portion to the pad.

2. The electronic assembly of claim 1, wherein the conductive adhesive comprises silver particles.

3. The electronic assembly of claim 1, wherein the second portion comprises at least one concave section.

4. The electronic assembly of claim 1, wherein the second portion is a disk.

5. The electronic assembly of claim 1, wherein the second portion has an opening formed there through.

6. The electronic assembly of claim 1, wherein the first portion has a compliant section formed therein.

7. The electronic assembly of claim 1, wherein the lead is made by a stamping operation.

8. The electronic assembly of claim 1, wherein the lead is shaped to form at least one heel along the edge.

9. The electronic assembly of claim 1, wherein the cured conductive adhesive has a solid form and is coupled to the lead, and the solid conductive adhesive is adapted to melt to secure the portion of the edge and the portion of the second portion to the pad.

10. The electronic assembly of claim 1, wherein the second portion has a shape defined by at least a first radius and a second radius, the first radius defining an upper portion of the edge, the second radius defining a lower portion of the edge, and the first radius is larger than the second radius.

11. The electronic assembly of claim 1, wherein the edge of the second portion includes a discontinuous portion formed by removing a portion of the substantially planar surface.

12. The electronic assembly of claim 1, wherein the edge of the second portion includes an indented side portion.

13. The electronic assembly of claim 1, wherein the edge of the second portion includes a projection.

14. The electronic assembly of claim 4, wherein the disk has an interior portion with an opening formed there through.

15. The electronic assembly of claim 14, wherein the disk has an upper portion proximate the first portion and the opening intersects the perimeter in the upper portion.

16. An electronic assembly, comprising:
a substrate having a conductive pad on the substrate;
a component having a lower surface disposed opposite the substrate and having a lead electrically and mechanically coupled to the conductive pad, the lead having:
an elongated portion having a first end extending from the lower surface of the component and a second end, and
a planar portion extending from and connected to the second end of the elongated portion, the planar portion having a surface area per unit length substantially greater than the elongated portion and having a substantially planar surface generally parallel to the elongated portion, the planar portion having an edge that contacts the conductive pad on the substrate; and
a conductive adhesive electrically and mechanically coupling the edge of the lead to the conductive pad, the conductive adhesive partially coating a portion of the edge and a portion of the planar portion,
wherein the component is positioned so that the conductive adhesive is in contact with the conductive pad before the conductive adhesive is cured.

17. The electronic assembly of claim 16, wherein the planar portion is coated by dipping into a tray of uncured conductive adhesive.

18. The electronic assembly of claim 16, wherein a solvent contained within the conductive adhesive is driven off.

19. The electronic assembly of claim 16, further comprising a curved edge on the planar portion of the lead adjacent to the conductive pad of the substrate.

20. The electronic assembly of claim 16, wherein the elongated portion of the lead is coated at least partially with the uncured conductive adhesive.

21. The electronic assembly of claim 16, wherein the conductive adhesive is cured by heating to less than or equal to 150° C.

22. The electronic assembly of claim 16, wherein:
the elongated portion has a shaft portion extending from the component in a first direction, the shaft portion has a first width normal to the first direction;
the planar portion has a major surface parallel to the first direction and a second width in a direction normal to the first direction, the second width is greater than the first width; and
a region is formed at the intersection of the elongated portion and the planar portion,
wherein the region receives uncured conductive adhesive.

23. The electronic assembly of claim 16, wherein the lead is made by a stamping operation.

24. The electronic assembly of claim 16, wherein the lead is shaped to form at least one heel along the edge.

25. The electronic assembly of claim 16, wherein the conductive adhesive has a solid form and is coupled to the lead, and the solid conductive adhesive is adapted to melt to secure the portion of the edge and the portion of the planar portion to the pad.

26. The electronic assembly of claim 16, wherein the planar portion has a shape defined by at least a first radius and a second radius, the first radius defining an upper portion of the edge, the second radius defining a lower portion of the edge, and the first radius is larger than the second radius.

27. The electronic assembly of claim 16, wherein the edge of the planar portion includes a discontinuous portion formed by removing a portion of the planar portion.

28. The electronic assembly of claim 16, wherein the edge of the planar portion includes an indented side portion.

29. The electronic assembly of claim 16, wherein the edge of the planar portion includes a projection.

30. An electronic assembly, comprising:
a first component having a lead extending from a lower surface of the first component, the lead having a post and a paddle, the paddle having a generally planar surface substantially parallel to the post and the planar surface having an edge;
a conductive adhesive coated at least partially on the paddle and partially on the edge of the paddle; and
a substrate disposed opposite the lower surface of the first component, the substrate having a conductive structure in contact with at least a portion of the edge of the paddle and the portion of the planar surface of the paddle is coated with the conductive adhesive,
wherein the first component is positioned to bring the conductive adhesive in contact with the conductive structure before curing the conductive adhesive.

31. The electronic assembly of claim 30, further comprising a concave portion on the paddle, the concave portion defining a region adjacent to the paddle, the region being bounded at least in part by an edge of the concave portion of the paddle,
wherein the region receives uncured conductive adhesive.

32. The electronic assembly of claim 30, wherein the conductive adhesive comprises a binder with a conductive filler therein.

33. The electronic assembly of claim 30, wherein the conductive adhesive is substantially free of lead (Pb).

34. The electronic assembly of claim 30, wherein the first component comprises a plurality of leads, each with a post and a paddle,
wherein the paddles are disposed substantially parallel to each other so that the paddles can be coated with conductive adhesive simultaneously.

35. The electronic assembly of claim 30, further comprising;
a second component, the second component having a plurality of leads, each of the leads having a paddle area; and
a second conductive adhesive coated on the paddle areas, the second conductive adhesive in contact with another conductive structure on the substrate.

36. The electronic assembly of claim 30, wherein the lead is made by a stamping operation.

37. The electronic assembly of claim 30, wherein the lead is shaped to form at least one heel along the edge.

38. The electronic assembly of claim 30, wherein the conductive adhesive has a solid form and is coupled to the lead, and the solid conductive adhesive is adapted to melt to secure the portion of the edge and the portion of the paddle to the pad.

39. The electronic assembly of claim 30, wherein the paddle has a shape defined by at least a first radius and a second radius, the first radius defining an upper portion of the edge, the second radius defining a lower portion of the edge, and the first radius is larger than the second radius.

40. The electronic assembly of claim 30, wherein the edge of the paddle includes a discontinuous portion formed by removing a portion of the paddle.

41. The electronic assembly of claim 30, wherein the edge of the paddle includes an indented side portion.

42. The electronic assembly of claim 30, wherein the edge of the paddle includes a projection.

43. The electronic assembly of claim 32, wherein the conductive filler comprises silver particles.

44. The electronic assembly of claim 35, wherein the conductive adhesive of the second component is cured separately from the conductive adhesive of the first component.

\* \* \* \* \*